(12) United States Patent
Jiang et al.

(10) Patent No.: US 11,239,756 B2
(45) Date of Patent: Feb. 1, 2022

(54) TROUBLESHOOTING METHOD AND APPARATUS FOR POWER SUPPLY DEVICE

(71) Applicant: HUAWEI TECHNOLOGIES CO., LTD., Guangdong (CN)

(72) Inventors: Zhengdong Jiang, Nuremberg (GB); Bo Xiao, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 122 days.

(21) Appl. No.: 16/790,027

(22) Filed: Feb. 13, 2020

(65) Prior Publication Data

US 2020/0186038 A1    Jun. 11, 2020

Related U.S. Application Data

(63) Continuation of application No. PCT/CN2018/099697, filed on Aug. 9, 2018.

(30) Foreign Application Priority Data

Aug. 18, 2017    (CN) .......................... 201710712675.2

(51) Int. Cl.
*H02M 3/158* (2006.01)
*H02J 7/00* (2006.01)
*G01R 31/40* (2020.01)

(52) U.S. Cl.
CPC .......... *H02M 3/1584* (2013.01); *G01R 31/40* (2013.01); *H02J 7/0029* (2013.01); *H02J 7/0047* (2013.01); *H02J 2207/20* (2020.01)

(58) Field of Classification Search
CPC .. H02M 3/1584; H02J 7/0029; H02J 2207/20; H02J 7/0047; G01R 31/40

(Continued)

(56) References Cited

U.S. PATENT DOCUMENTS

| 5,726,849 | A | 3/1998 | Nakamura |
| 7,957,160 | B2 * | 6/2011 | Babcock et al. ...... H02M 7/493 |
| | | | 363/16 |

(Continued)

FOREIGN PATENT DOCUMENTS

| CN | 201045748 Y | 4/2008 |
| CN | 103344870 A | 10/2013 |

(Continued)

*Primary Examiner* — Sun J Lin
(74) *Attorney, Agent, or Firm* — Womble Bond Dickinson (US) LLP

(57) ABSTRACT

Embodiments of the application disclose a troubleshooting method and device. The method is applicable to an inverter power supply system in the power supply device. The inverter power supply system includes at least two direct current to direct current (DC/DC) power supply modules, and any DC/DC power supply module of the at least two DC/DC power supply modules includes fuses F1 and F2, relays K1 and K2, inductors L1 and L2, switch modules Q1, Q2, and Q3, and direct current bus capacitors C1 and C2. The troubleshooting method includes: if it is detected that any DC/DC power supply module of the at least two DC/DC power supply modules is a faulty module, determining a faulty component in the faulty module; and if the faulty component is a C1 or a C2, and the inverter power supply system is in a battery discharging mode, turning on a Q2 in the faulty module, so that an F1 and an F2 of the faulty module are blown, thereby disconnecting the faulty module from another DC/DC power supply module.

10 Claims, 5 Drawing Sheets

(58) Field of Classification Search
USPC .......................................................... 320/134
See application file for complete search history.

(56) References Cited

U.S. PATENT DOCUMENTS

| | | | |
|---|---|---|---|
| 8,513,928 B2 * | 8/2013 | Totterman et al. . | H02M 3/1582 |
| | | | 323/271 |
| 10,263,457 B2 * | 4/2019 | Nishimura et al. ... | H02M 7/493 |
| 2012/0169126 A1 | 7/2012 | Tötterman et al. | |
| 2018/0076656 A1 | 3/2018 | Nishimura et al. | |

FOREIGN PATENT DOCUMENTS

| | | | |
|---|---|---|---|
| CN | 103415987 A | 11/2013 | |
| CN | 105991054 A | 10/2016 | |
| CN | 107359688 A | 11/2017 | |
| EP | 1317042 A2 | 6/2003 | |
| JP | H066984 A | 1/1994 | |
| JP | 2002291236 A | 10/2002 | |
| WO | 2016157469 A1 | 10/2016 | |

* cited by examiner

TROUBLESHOOTING METHOD AND APPARATUS FOR POWER SUPPLY DEVICE

CROSS-REFERENCE TO RELATED APPLICATIONS

This application is a continuation of International Application No. PCT/CN2018/099697, filed on Aug. 9, 2018, which claims priority to Chinese Patent Application No. 201710712675.2, filed on Aug. 18, 2017. The disclosures of the aforementioned applications are hereby incorporated by reference in their entireties.

TECHNICAL FIELD

Embodiments of the invention relate to the field of electronic technologies, and in particular, to a troubleshooting method and apparatus for a power supply device.

BACKGROUND

An inverter power supply system is widely applied to various devices having high requirements for power supply reliability, and is configured to supply power to loads having high requirements for power supply stability. For example, in the communications field, an inverter power supply system such as an inverter or an uninterruptible power supply system (UPS) is usually used to supply power to key loads having high requirements for power supply stability.

In the prior art, as a capacity of an inverter power supply system is increasing, more power supply modules in the inverter power supply system are connected in parallel. A plurality of direct current/direct current conversion functional circuits (or referred to as a direct current/direct current power supply, DC/DC) are often connected in parallel. In a scenario in which the plurality of power supply modules are connected in parallel in the inverter power supply system, if one of the plurality of power supply modules is faulty when the inverter power supply system is running, there is a fault circuit in the plurality of power supply modules, and therefore other normal modules cannot work normally. A power output of the inverter power supply system is interrupted, and this affects normal operating of the key loads. Therefore, power supply stability of a device is low, and power supply reliability is poor.

SUMMARY

Embodiments of the application provide a troubleshooting method and apparatus for a power supply device, to improve stability and power supply reliability of a DC/DC circuit, and to improve applicability of an inverter power supply system.

A first aspect provides a troubleshooting method for a power supply device, where the troubleshooting method is applicable to an inverter power supply system in the power supply device. The inverter power supply system includes at least two direct current to direct current (DC/DC) power supply modules, the at least two DC/DC modules are connected in parallel to a same battery and supply power to a load by using a direct current to alternating current DC/AC power supply. Any one of the at least two DC/DC modules includes fuses F1 and F2, relays K1 and K2, inductors L1 and L2, switch modules Q1, Q2, and Q3, and direct current bus capacitors C1 and C2. One terminal of the K1 is connected to a positive terminal of the battery by using the F1, one terminal of the K2 is connected to a negative terminal of the battery by using the F2, the other terminal of the K1 is connected to connection terminals of the Q1 and the Q2 by using the L1, the other terminal of the K2 is connected to connection terminals of the Q2 and the Q3 by using the L2, one terminal of the Q1 is connected to one terminal of the C1, the other terminal of the Q1 is connected to one terminal of the Q2, the other terminal of the Q2 is connected to one terminal of the Q3, the other terminal of the C1 is connected to the other terminal of the Q3 by using the C2. The troubleshooting method includes:

This troubleshooting method can detect a voltage signal and/or a battery signal of any one of the DC/DC modules, and determine whether a faulty module exists based on the detected voltage signal and/or battery signal. The voltage signal of the DC/DC module may include a battery voltage signal, a direct current bus voltage signal, and/or the like. The current signal of the DC/DC module may include a current signal of the inductor L1 and/or the L2, and/or the like.

One terminal of the K1 is connected to a positive terminal of the battery by using the F1, one terminal of the K2 is connected to a negative terminal of the battery by using the F2, one terminal of the K1 is connected to one terminal of the Q1 and one terminal of the Q2 by using the L1, one terminal of the K2 is connected to one terminal of the Q2 and one terminal of the Q3 by using the L2, one terminal of the Q1 is connected to one terminal of the C1, one terminal of the Q1 is connected to one terminal of the Q2, one terminal of the Q2 is connected to one terminal of the Q3, the other terminal of the C1 is connected to one terminal of the Q3 by using the C2. The troubleshooting method includes:

if it is detected that any one of the at least two DC/DC modules is faulty, determining a faulty component in the faulty module, where the faulty module is any one of the at least two DC/DC modules that is faulty; and if the faulty component is a C1 or a C2, and the inverter power supply system is in a battery discharging mode, turning on a Q2 in the faulty module, so that an F1 and an F2 of the faulty module are blown, to disconnect the faulty module from another DC/DC module.

In this embodiment of the application, when it is detected that any one of the DC/DC modules is faulty, the faulty module may be isolated from the another DC/DC module, to ensure normal working of the another module that is different from the faulty module and that is connected in parallel, ensure a normal power supply state of the inverter power supply system, and improve power supply reliability of the inverter power supply system.

In one embodiment, the troubleshooting method further includes: if a short circuit component is the C1 or the C2, and the inverter power supply system is in a battery charging mode, turning off a Q1 and a Q3 of the faulty module, and turning on the Q2 of the faulty module after a preset time interval, so that the F1 and the F2 of the faulty module are blown, to disconnect the faulty module from the another DC/DC module. In this embodiment of the application, regardless of whether the inverter power supply system is in the battery discharging mode, the battery charging mode, or another working state, when it is detected that any one of the DC/DC modules is faulty, the faulty module may be isolated from the another DC/DC module, to ensure normal working of the another module that is different from the faulty module and that is connected in parallel, further ensure power supply stability of the inverter power supply system, improve power supply reliability of the inverter power supply system, and enhance applicability.

In one embodiment, after detecting the faulty module and when the Q2 and the Q1 of the faulty module are in an off state, the inverter power supply system may further turn on the Q3 of the faulty module and detect current states of an L1 and an L2 of the faulty module. The detecting current states of an L1 and an L2 may include detecting whether there is a current in the L1 or the L2. If it is detected that there is a current both in the L1 and the L2 of the faulty module, the inverter power supply system determines that the Q1 of the faulty module is short-circuited. When the Q3 is working, the inverter power supply system detects that there is a current both in the L1 and the L2 of the faulty module, and there is a current only in an L2 of a normal module (for example, the another DC/DC module) (in this case, a Q3 of the another DC/DC module is in an on state, and a Q1 and a Q2 are both in an off state, and therefore there is no current in an L1 of the another DC/DC module). Therefore, if detecting that there is a current both in an L1 and an L2 of a DC/DC power converter 1, the inverter power supply system may determine that the Q1 of the faulty module is short-circuited. It is convenient to detect the faulty component in the faulty module, and therefore detection efficiency is higher.

In one embodiment, after detecting the faulty module and when the Q2 and the Q3 of the faulty module are in an off state, the inverter power supply system may further turn on the Q1 of the faulty module and detect the current states of the L1 and the L2 of the faulty module. If detecting that there is a current both in the L1 and the L2 of the faulty module, the inverter power supply system may determine that the Q3 of the faulty module is short-circuited. When a Q1 is working, if a DC/DC module is faulty (for example, a Q3 of the DC/DC module is short-circuited), there is a current both in an L1 and an L2 of the DC/DC module. In this case, there is a current only in an L1 of a normal module (namely, another DC/DC module) (in this case, a Q1 of another DC/DC module 2 is in an on state, a Q2 and a Q3 are both in an off state, and therefore there is no current in an L2 of the another DC/DC module). Therefore, if the inverter power supply system detects that there is a current both in the L1 and the L2 of the faulty module, the Q3 of the faulty module is faulty. This provides diversified manners of detecting the faulty component in the faulty module, enhances convenience of detecting the faulty component in the faulty module, and improves efficiency of detecting the faulty component.

In one embodiment, the troubleshooting method further includes: when a short circuit component in the faulty module is the Q1 or the Q3, turning on the Q2 of the faulty module, so that the F1 and the F2 of the faulty module are blown, to disconnect the faulty module from the another DC/DC module. Isolation of the faulty module ensures normal working of the another module in the inverter power supply system, ensures normal power supply of the inverter power supply system, improves power supply reliability of the inverter power supply system, and enhances applicability.

In one embodiment, the troubleshooting method further includes: when a short circuit component in the faulty module is the Q1 or the Q3, turning off any one or more of a K1, a K2, the Q1, the Q2, or the Q3 of the faulty module, to disconnect a connection between the faulty module and a battery, and disconnect a parallel connection between the faulty module and the another DC/DC module. This leads to a simpler operation, adds a manner of isolating the faulty module, and enhances flexibility of the operation.

A second aspect provides a power supply device, where the power supply device includes an inverter power supply system. The inverter power supply system includes at least two DC/DC modules, the at least two DC/DC modules are connected in parallel to a same battery and supply power to a load by using a direct current to alternating current DC/AC power supply. Any one of the at least two DC/DC modules includes fuses F1 and F2, relays K1 and K2, inductors L1 and L2, switch modules Q1, Q2, and Q3, and direct current bus capacitors C1 and C2. One terminal of the K1 is connected to a positive terminal of the battery by using the F1, one terminal of the K2 is connected to a negative terminal of the battery by using the F2, one terminal of the K1 is connected to one terminal of the Q1 and one terminal of the Q2 by using the L1, one terminal of the K2 is connected to one terminal of the Q2 and one terminal of the Q3 by using the L2, one terminal of the Q1 is connected to one terminal of the C1, one terminal of the Q1 is connected to one terminal of the Q2, one terminal of the Q2 is connected to one terminal of the Q3, and the other terminal of the C1 is connected to one terminal of the Q3 by using the C2.

The any one of the at least two DC/DC modules includes: a detecting unit and a control unit. The detection unit is configured to detect a voltage signal and/or a current signal in the any one of the DC/DC modules, and determine, based on the detected voltage signal and/or the detected current signal, whether the any one of the DC/DC modules is faulty. The detection unit is further configured to, when detecting that the any one of the DC/DC modules is faulty, detect a faulty component in the faulty module. The control unit is configured to, when the detection unit detects that the faulty component in the faulty module is a C1 or a C2, and the inverter power supply system is in a battery discharging mode, turn on a Q2 of the faulty module, where an F1 and an F2 of the faulty module are blown, to disconnect the faulty module from another DC/DC module.

In one embodiment, the control unit is further configured to: when the detection unit detects that the faulty component in the faulty module is the C1 or the C2, and the inverter power supply system is in a battery charging mode, turn off a Q1 and a Q3 of the faulty module, and turn on the Q2 of the faulty module after a preset time interval, so that the F1 and the F2 of the faulty module are blown, to disconnect the faulty module from the another DC/DC module.

In one embodiment, the detection unit is further configured to: when the Q2 and the Q1 of the faulty module are in an off state, turn on the Q3 of the faulty module and detect a current state of the L1 and the L2 of the faulty module, and if it is detected that there is a current both in the L1 and the L2 of the faulty module, determine that the Q1 of the faulty module is short-circuited; or when the Q2 and the Q3 of the faulty module are in an off state, turn on the Q1 of the faulty module and detect a current state of the L1 and the L2 of the faulty module, and if it is detected that there is a current both in the L1 and the L2 of the faulty module, determine that the Q3 of the faulty module is short-circuited.

In one embodiment, the control unit is further configured to: when the detection unit detects that the short circuit component in the faulty module is the Q1 or the Q3, turn on the Q2 of the faulty module, so that the F1 and the F2 of the faulty module are blown, to disconnect the faulty module from the another DC/DC module.

In one embodiment, the control unit is further configured to: when the detection unit detects that the short circuit component in the faulty module is the Q1 or the Q3, turn off any one or more of a K1, a K2, the Q1, the Q2, or the Q3 of the faulty module, to disconnect a parallel connection between the faulty module and the another DC/DC module.

In this embodiment of the application, the inverter power supply system may detect a fault in each DC/DC module by using the detection unit or another logical control module built in each DC/DC module. After detecting the faulty module, the inverter power supply system controls the on or off state of the switch module, for example, the Q1, the Q2, or the Q3, by using the control unit (or referred to as a drive unit), to isolate the faulty module. This ensures normal working of the another DC/DC module in the inverter power supply system, ensures normal power supply of the inverter power supply system, improves power supply reliability of the inverter power supply system, and enhances applicability.

BRIEF DESCRIPTION OF DRAWINGS

To describe technical solutions in embodiments of the application more clearly, the following illustrates accompanying drawings required for illustration in the embodiments of the application.

DESCRIPTION OF EMBODIMENTS

The following describes the embodiments of the application with reference to the accompanying drawings in the embodiments of the application.

Figure 1:
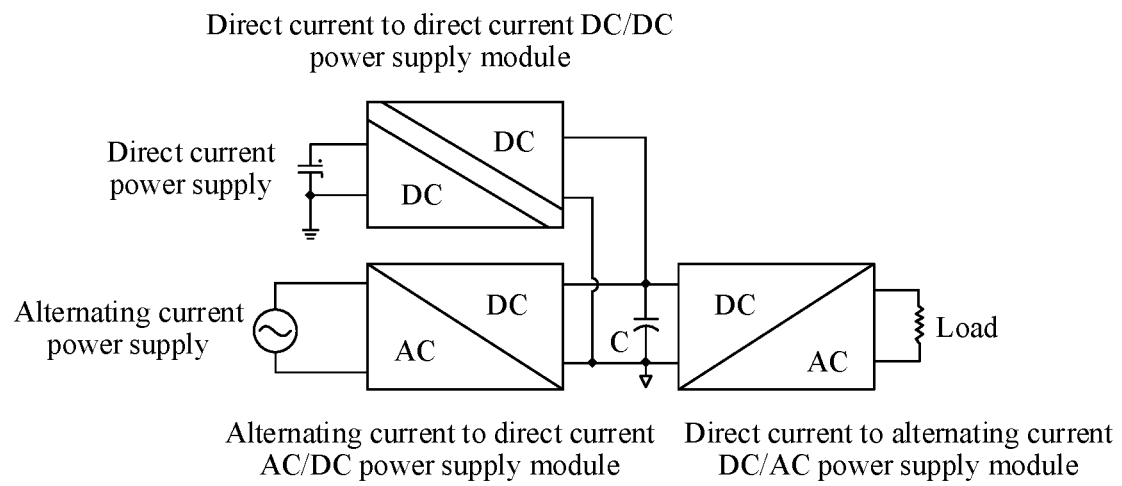
FIG. 1 is a schematic diagram of a structure of an inverter power supply system.

FIG. 1 is a schematic diagram of a structure of an inverter power supply system. As shown in FIG. 1, in a block diagram of a typical inverter power supply system, the inverter power supply system mainly includes three parts, including a DC/DC module (also referred to as a DC/DC power converter), an alternating current to direct current AC/DC power supply module (also referred to as an AC/DC power converter), a direct current to alternating current DC/AC power supply module (also referred to as a DC/AC power converter), and the like. The inverter power supply system generally has three power ports: a direct current (for example, a battery) input port, an alternating current (for example, mains) input port, and an alternating current output port. The three power ports respectively correspond to the three power converters. The direct current input port corresponds to the DC/DC power converter, the alternating current input port corresponds to the AC/DC power converter, and the alternating current output port corresponds to the DC/AC power converter. The DC/DC power converter boosts a battery low voltage input by the direct current input port to a direct current high voltage, and outputs it to an input port of the DC/AC power converter. The input port of the DC/AC power converter is two terminals of a capacitor C, and voltages at the two terminals of the capacitor C are also referred to as direct current bus voltages. The AC/DC power converter converts an alternating current input by the alternating current input port into a direct current, corrects an input power factor, and outputs the direct current to the two terminals of the capacitor C. The capacitor C stores energy and obtains the direct current bus voltages. The DC/AC power converter converts a direct current high voltage of a direct current bus into an alternating current, and outputs the alternating current to a load by using the alternating current output port, to supply power to the load. A filter capacitor C with a relatively large capacity is connected to the direct current bus. When the mains power supply is normal, an alternating current mains input is usually converted by the AC/DC power converter and the DC/AC power converter into an alternating current that complies with a specification to supply power to a key load. When the mains power supply fails, a direct current voltage output by the battery is boosted to a direct current high voltage by the DC/DC power converter, the direct current high voltage is output to the direct current bus and is converted by a DC/AC power inverter into an alternating current that complies with the specification to supply power to the key load. This meets an uninterruptible power supply requirement of the key load.

The direct current bus described in this embodiment of the application may be a bus in the inverter power supply system. This is not limited herein.

The DC/DC power converter can implement bidirectional energy flow and support two working modes: a battery discharging mode and a battery charging mode. In the battery discharging mode, the battery outputs a direct current voltage, and the DC/DC power converter outputs a direct current high voltage to the direct current bus, so that a voltage of the direct current bus is maintained at a high level. In the battery discharging mode, the capacitor C on the direct current bus is in an energy storage state. In a working mode in which the mains power supply is normal, the mains power supply outputs a direct current high voltage to the direct current bus by using the AC/DC power converter, and the capacitor C on the direct current bus stores energy. In the battery charging mode, the capacitor C charges, by using the DC/DC power converter, the battery for energy storage.

To meet a voltage inversion requirement of the AC/DC power converter, a valid inversion output value of the AC/DC power converter is a 230 V sine alternating current, and at least a direct current bus voltage 230 V×1.414=325.22 V is required. Therefore, a pulse width modulation (PWM) power converter, such as a forward converter, a push-pull converter, or a full bridge converter, is usually used to meet a requirement of an input and output voltage variation range. In other words, the forward converter, the push-pull converter, or the full bridge converter may be configured as the DC/DC power converter, the AC/DC power converter, and the DC/AC power converter shown in FIG. 1. As shown in FIG. 1, the DC/DC power converter is connected to an output terminal of the AC/DC power converter of the alternating current mains power supply, and generates the direct current high voltage through filtering by the capacitor C on the direct current bus. In this way, the battery and the mains power supply function as a mutual backup for each other, to meet the uninterruptible power supply requirement.

Figure 2:
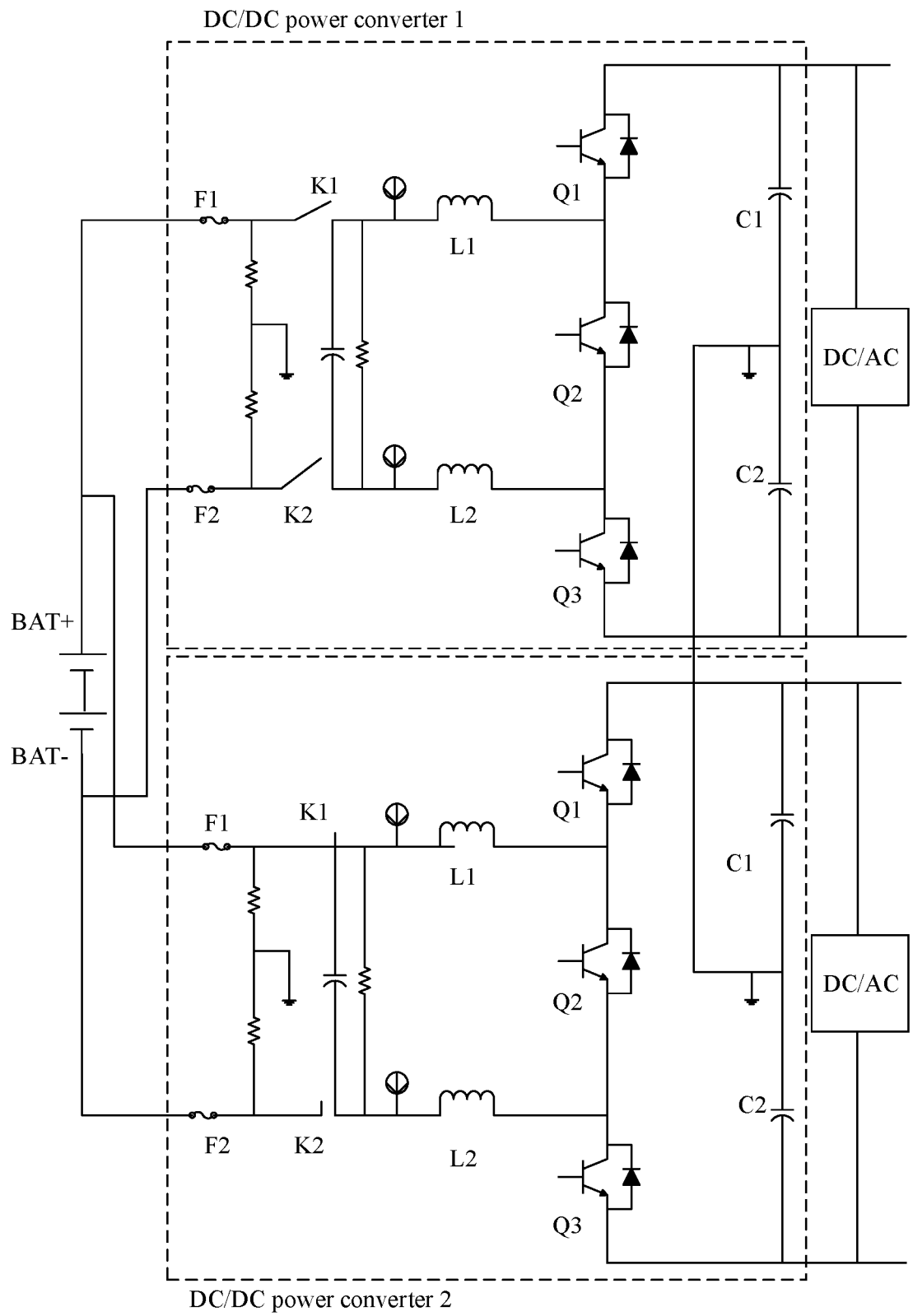
FIG. 2 is a schematic connection diagram of a power converter according to an embodiment of the application.

However, as a capacity of the inverter power supply system increases, more power converters are used in parallel in the inverter power supply system, and a plurality of DC/DC power converters are used in parallel. FIG. 2 is a schematic connection diagram of a power converter according to an embodiment of the application. As shown in FIG. 2, two DC/DC power converters are connected in parallel to a same battery string, and each DC/DC power converter is connected in parallel to one DC/AC power converter, to supply power to a load by using the DC/AC power converter. FIG. 2 shows only two DC/DC power converters. In one embodiment, a quantity of DC/DC power converters may be determined based on a requirement in an actual application scenario. This is not limited herein. The DC/DC power converter shown in FIG. 2 may be further connected in parallel to an AC/DC power converter. The DC/DC power converter shown in FIG. 1 may be a plurality of DC/DC power converters connected in parallel. This is not limited herein.

FIG. 2 is a schematic diagram of a connection between some components of the two DC/DC power converters connected in parallel. The DC/DC power converter may further include more components. A connection manner of the components may be set based on a function of the DC/DC power converter required in an actual application scenario. This is not limited herein. In this embodiment of the application, a structure of the power converter shown in FIG. 2 is used as an example for description.

As shown in FIG. 2, any one of the two DC/DC power converters (the following embodiment uses a DC/DC power converter 1 as an example) may include fuses F1 and F2, relays K1 and K2, inductors L1 and L2, switch modules Q1, Q2, and Q3, and direct current bus capacitors C1 and C2. One terminal of the K1 is connected to a positive terminal (BAT+) of a battery by using the F1, one terminal of the K2 is connected to a negative terminal (BAT−) of the battery by using the F2, one terminal of the K1 is connected to the positive terminal of the battery by using the F1, one terminal of the K2 is connected to the negative terminal of the battery by using the F2, the other terminal of the K1 is connected to connection terminals of the Q1 and the Q2 by using the L1, the other terminal of the K2 is connected to connection terminals of the Q2 and the Q3 by using the L2, one terminal of the Q1 is connected to one terminal of the C1, the other terminal of the Q1 is connected to one terminal of the Q2, the other terminal of the Q2 is connected to one terminal of the Q3, and the other terminal of the C1 is connected to the other terminal of the Q3 by using the C2. A troubleshooting method includes:

The Q1, Q2, or Q3 may be a switch transistor, for example, an MOS transistor. This is not limited herein.

In a battery discharging mode, the Q2 of the DC/DC power converter is turned on, and a current from the BAT+ terminal of the battery flows through the F1 and the K1 and arrives at the L1, and flows through the Q2, the L2, the K, and the F2 and arrives at the BAT− terminal, to store energy for the L1 and the L2. When the Q2 is turned off and the Q1 and the Q3 are turned on, the energy stored by the L1 and the L2 may pass through the Q1 and the Q3 to charge the C1 and the C2. In a battery charging mode, when the Q1 and the Q3 of the DC/DC power converter are turned on, a current from a direct current bus flows from the positive terminal of the C1, and flows through the Q1, to store energy for the L1 and the L2. When the Q1 and the Q3 are turned off and the Q2 is turned on, the energy stored by the L1 and the L2 may flow through the F1 and arrive at the BAT+ terminal of the battery, to charge the battery. In a normal working process of the DC/DC power converter, both the DC/DC power converter 1 and the DC/DC power converter 2 have their respective working circuits that are independent of each other and do not affect each other.

Figure 3:
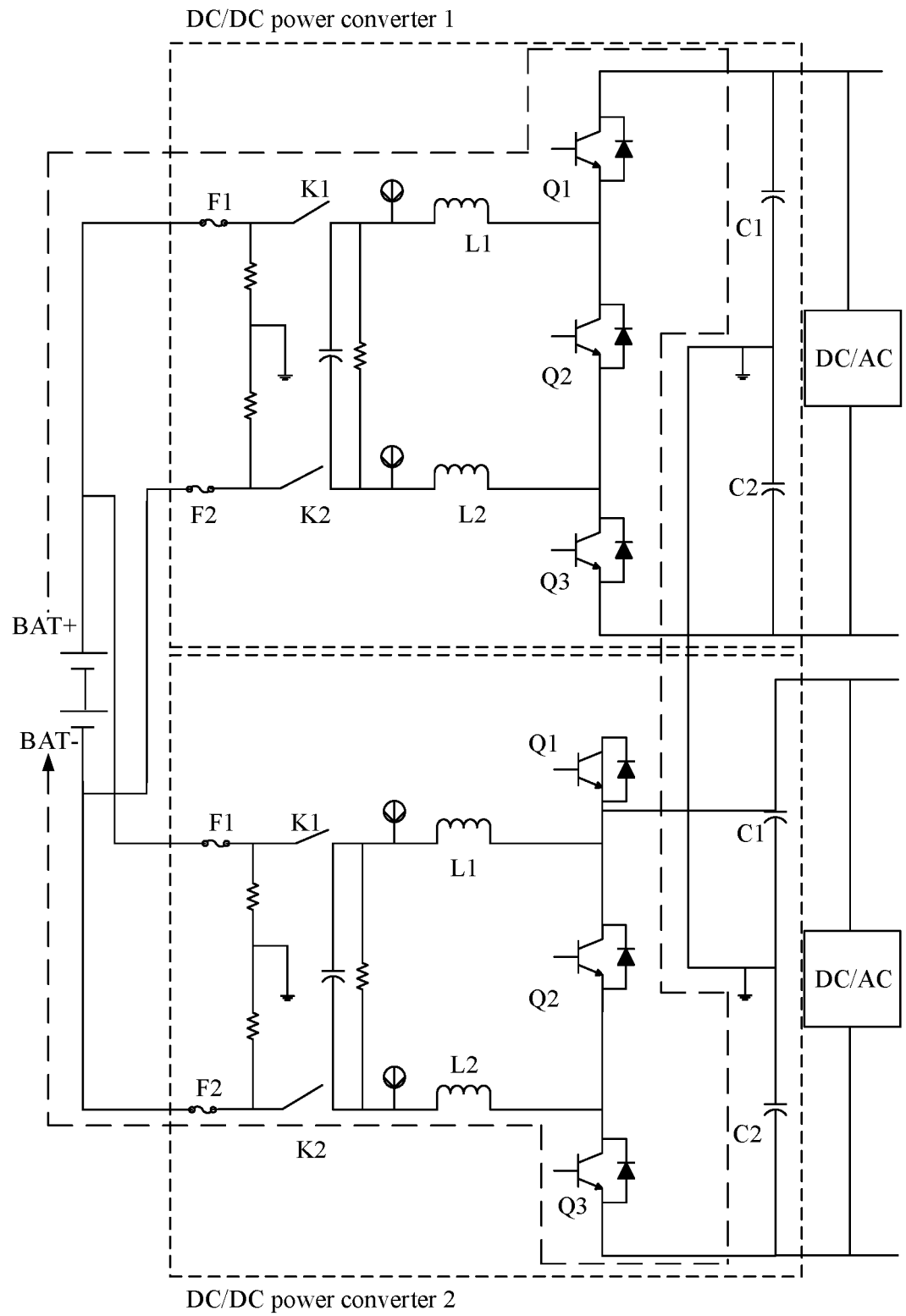
FIG. 3 is a schematic diagram of a fault circuit according to an embodiment of the application.

In a working process of the DC/DC power converter, if a component of the DC/DC power converter 1 is faulty, for example, is short-circuited, a normal working state of a DC/DC power converter 2 is affected. As a result, power supply of an inverter power supply system is interrupted, and normal working of a key load is affected. For example, if a C1 of the DC/DC power converter 1 is short-circuited, a fault circuit is formed between the DC/DC power converter 1 and the DC/DC power converter 2. As a result, an undamaged module or device, for example, the DC/DC power converter 2, cannot work normally, and output of the inverter power supply system is interrupted. The DC/DC power converter 1 and the DC/DC power converter 2 share the battery string, and are used in parallel. When the C1 of the DC/DC power converter 1 is short-circuited, there may be a short circuit current of a short circuit path shown by a dashed line with an arrow in FIG. 3 between the DC/DC power converter 1 and the DC/DC power converter 2. FIG. 3 is a schematic diagram of a fault circuit according to an embodiment of the application. The short circuit current on the path shown in FIG. 3 causes a direct current bus overvoltage (namely, a voltage between a positive terminal of a C1 and a negative terminal of a C2 of the DC/DC power converter 2) of the DC/DC power converter 2, and further causes the DC/DC power converter 2 to exit a normal working mode.

In one embodiment, each DC/DC power converter in the inverter power supply system may include a detection unit (also referred to as a fault detection unit), a control unit, and the like. For ease of description, the following uses a detection unit and a control unit in the DC/DC power converter 1 as an example for description. The detection unit is mainly configured to detect a voltage signal and/or a current signal. In one embodiment, the detection unit may be configured to detect a battery voltage, a direct current bus voltage, and the like, and may also be configured to sample a current of the inductor. In one embodiment, the detection unit detects the voltage between the positive terminal of the C1 and the negative terminal of the C2 of the DC/DC power converter 2. If the detection unit detects the direct current bus voltage (namely, the voltage between the positive terminal of the C1 and the negative terminal of the C2 of the DC/DC power converter 2) of the DC/DC power converter 2, the detection unit may determine that the C1 or a C2 of the DC/DC power converter 1 is short-circuited because the battery voltage is divided by using the bus capacitor on each power converter. The detection unit may transmit the detected voltage signal and/or the detected battery signal to a processing unit by using a sensor and/or a current sampling circuit. The control unit processes the voltage signal and/or the current signal detected by the detection unit, sends a control signal, and controls on and off of the relay and the switch transistor by using a drive circuit.

In one embodiment, the control unit may also be referred to as a processing unit, and may be a processor of the inverter power supply system, for example, a central processing unit (CPU), configured to process a voltage signal and/or a current signal of each DC/DC power converter, and another functional module in the inverter power supply system.

In one embodiment, the detection unit in the DC/DC power converter 1 may detect a working status of each component in the DC/DC power converter 1. When detecting that the DC/DC power converter 1 is faulty, the detection unit in the DC/DC power converter 1 may further detect a faulty component in the DC/DC power converter 1. In one embodiment, the DC/DC power converter 1 may further perform drive control, namely, turn on or off the Q1, the Q2, or the Q3 by using the built-in control unit (or referred to as the processing unit or a drive unit) of the DC/DC power converter 1. For details, refer to a drive control manner of an inverter power supply system in the prior art, and this is not limited herein.

In one embodiment, when the C1 of the DC/DC power converter 1 is faulty, a working mode of the DC/DC power converter 1 may be the battery discharging mode or the battery charging mode. In one embodiment, the detection unit detects the voltage between the positive terminal of the C1 and the negative terminal of the C2 of the DC/DC power converter 2. If the detection unit detects the direct current bus voltage (namely, the voltage between the positive terminal of the C1 and the negative terminal of the C2 of the DC/DC power converter 2) of the DC/DC power converter 2, the detection unit may determine that the C1 or the C2 of the DC/DC power converter 1 is short-circuited because the battery voltage is divided by using the bus capacitor on each power converter. When the C1 of the DC/DC power converter 1 is faulty, the working mode of the DC/DC power converter 1 is the battery charging mode and the Q1 and the Q3 of the DC/DC power converter 1 are in an on state. To avoid the fault circuit shown by the dashed line with an arrow in FIG. 3 between the DC/DC power converter 1 and the DC/DC power converter 2 after the C1 of the DC/DC power converter 1 is faulty, when the inverter power supply system detects that the C1 of the DC/DC power converter 1 is short-circuited, the inverter power supply system immediately turns off the Q1 and the Q3 of the DC/DC power converter 1 to stop the battery charging mode of the DC/DC power converter 1, so that the faulty C1 of the DC/DC power converter 1 does not affect the normal working mode of the DC/DC power converter 2. Further, the inverter power supply system may turn on the Q2 of the DC/DC power converter 1 after a preset time interval since the inverter power supply system turns off the Q1 and the Q3 of the DC/DC power converter 1, so that the DC/DC power converter 1 enters an abnormal working mode. After the Q2 of the DC/DC power converter 1 is turned on, the current output by the BAT+ terminal of the battery flows through the F1, the K1, the L1, and the Q2 of the DC/DC power converter 1, then through the L2, the K2, and the F2, and returns to the BAT− terminal of the battery. In this abnormal working mode, the current of the F1 and the F2 of the DC/DC power converter 1 is excessively high, and consequently the F1 and the F2 are blown. Therefore, the DC/DC power converter 1 is isolated from the DC/DC power converter 2 and another module connected in parallel, to ensure normal working of the DC/DC power converter and the another module connected in parallel, and ensure a normal power supply state of the inverter power supply system. In one embodiment, the preset time interval between a time point at which the Q1 and the Q3 of the DC/DC power converter 1 are turned off and a time point at which the Q2 is turned on may be set based on a requirement of an actual application scenario, and may be greater than or equal to a shortest time interval (for example, 2 µs) for ensuring that the Q1, the Q2, and the Q3 are not simultaneously turned on. To avoid an excessively long fault detection time of the inverter power supply system, set a short preset time interval. This may be determined based on the actual application scenario. This is not limited herein.

In one embodiment, when the C1 of the DC/DC power converter 1 is faulty, the working mode of the DC/DC power converter 1 is the battery discharging mode. In this case, the current of the DC/DC power converter 1 flows from the BAT+ terminal of the battery to another component. To avoid the fault circuit shown by the dashed line with an arrow in FIG. 3 between the DC/DC power converter 1 and the DC/DC power converter 2 after the C1 of the DC/DC power converter 1 is faulty, when the inverter power supply system detects that the C1 of the DC/DC power converter 1 is short-circuited, the inverter power supply system may directly turn on the Q2 of the DC/DC power converter 1, so that the faulty C1 of the DC/DC power converter 1 does not affect the normal working mode of the DC/DC power converter 2. After the Q2 of the DC/DC power converter 1 is turned on, the current output by the BAT+ terminal of the battery flows through the F1, the K1, the L1, and the Q2 of the DC/DC power converter 1, then through the L2, the K2, and the F2, and returns to the BAT− terminal of the battery. In this abnormal working mode, the current of the F1 and the F2 of the DC/DC power converter 1 is excessively high, and consequently the F1 and the F2 are blown. Therefore, the DC/DC power converter 1 is isolated from the DC/DC power converter 2 and another module connected in parallel, to ensure normal working of the DC/DC power converter and the another module connected in parallel, ensure the normal power supply state of the inverter power supply system, and improve power supply stability and applicability of the inverter power supply system.

Figure 4:
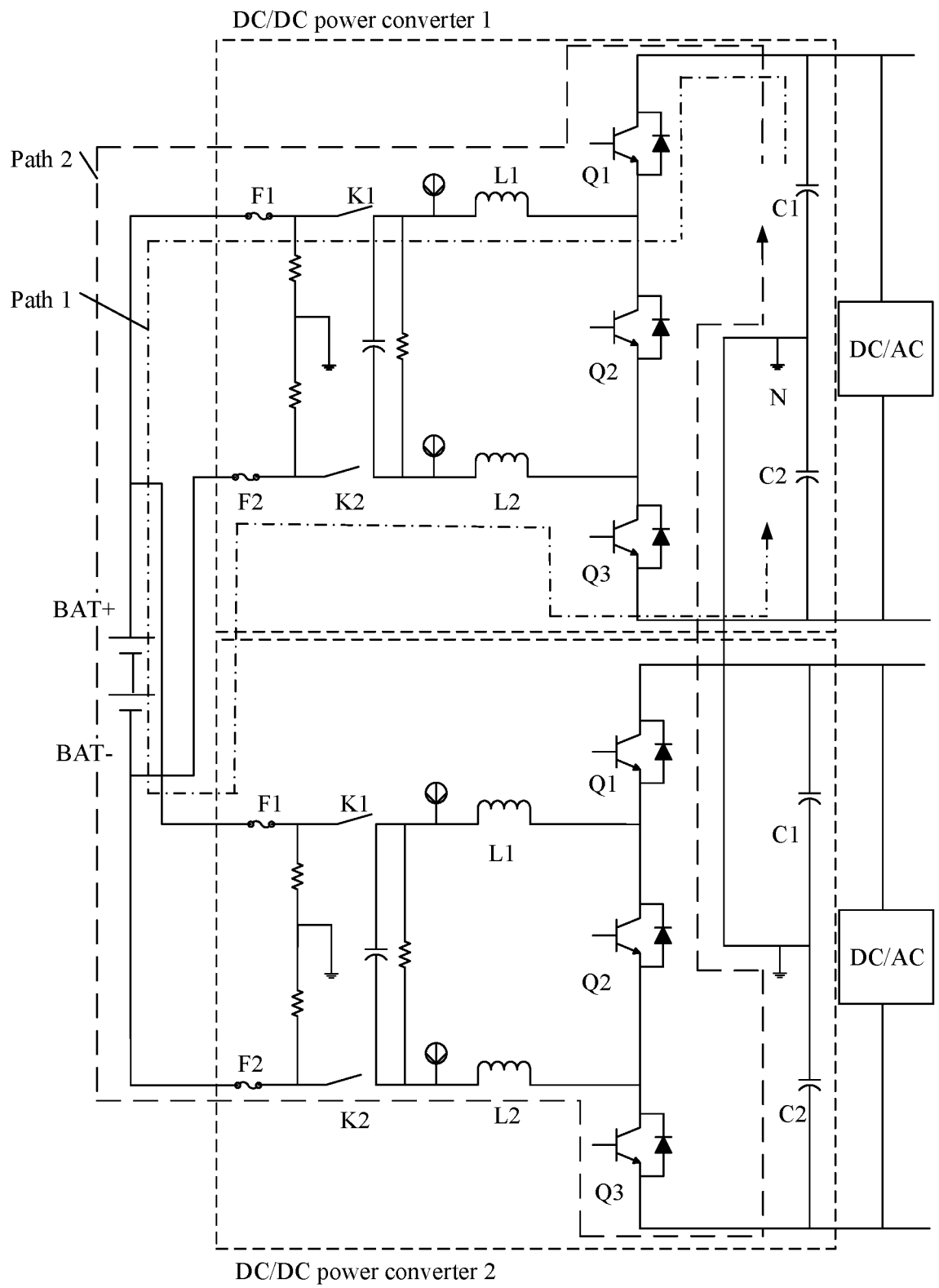
FIG. 4 is a schematic diagram of another fault circuit according to an embodiment of the application.

In one embodiment, when a plurality of power supply modules such as the DC/DC power converter 1 and the DC/DC power converter 2 are connected in parallel and the power supply modules are in the battery charging mode, after a Q1 of a power supply module (for example, the DC/DC power converter 1) is short-circuited, a fault circuit current on a faulty path 1 shown in FIG. 4 is formed in the DC/DC power converter 1. FIG. 4 is a schematic diagram of another fault circuit according to an embodiment of the application. A fault circuit current on a faulty path 2 shown in FIG. 4 is formed between the DC/DC power converter 1 and the DC/DC power converter 2. As a result, sampling of a charging current by the DC/DC power converter 2 (namely, a normal module) is inaccurate, and the normal module cannot be normally charged.

In one embodiment, after the Q1 of the DC/DC power converter 1 is short-circuited and fails, resistance of the BAT+ and the BAT− terminals of the battery to a remote common ground terminal N of the C1 and the C2 of the DC/DC power converter 1 changes, and consequently voltages of the positive and negative terminals of the battery in the power supply modules (including the DC/DC power converter 2) to the N are asymmetric. A bias voltage state is formed. When the power supply modules are in the bias voltage state, the fault detection unit in the inverter power supply system is triggered to detect working statuses of the power supply modules. When the fault detection unit detects the working statuses of the power supply modules (for example, the DC/DC power converter 1 and the DC/DC power converter 2, the following uses the DC/DC power converter 1 as an example), the Q3 of the DC/DC power converter 1 may be first turned on, for example, the inverter power supply system turns on the Q3 of the DC/DC power converter 1 for 3 µs (a duration may be defined based on a requirement of the actual application scenario). When the Q3 is working, if the DC/DC power converter 1 is faulty (for example, the Q1 is short-circuited), there is a current both in the L1 and the L2 of the DC/DC power converter 1, and there is a current only in an L2 of the normal module (for example, the DC/DC power converter 2) (in this case, a Q3 of the DC/DC power converter 2 is in an on state, and a Q1 and a Q2 are both in an off state, and therefore there is no current in an L1 of the DC/DC power converter 2). Therefore, if detecting that there is a current both in the L1 and the L2 of the DC/DC power converter 1, the inverter power supply system may determine that the Q1 of the DC/DC power converter 1 is short-circuited.

In one embodiment, the inverter power supply system may alternatively detect whether the Q3 of the DC/DC power converter (a DC/DC power conversion module 1, a DC/DC power conversion module 2, or the like, and the DC/DC power conversion module 1 is used as an example) is faulty. In one embodiment, the current in the L1 and the L2 is detected after the Q1 of the DC/DC power converter 1 is turned on. When the Q1 is working, if the DC/DC power converter 1 is faulty (for example, the Q3 of the DC/DC power converter 1 is short-circuited), there is a current both in the L1 and the L2 of the DC/DC power converter 1. In this case, there is a current only in an L1 of the normal module (namely, the DC/DC power converter 2) (in this case, the Q1 of the DC/DC power converter 2 is in an on state, the Q2 and the Q3 are both in an off state, and therefore there is no current in the L2 of the DC/DC power converter 2). Therefore, if detecting that there is a current both in the L1 and the L2 of the DC/DC power converter 1, the inverter power supply system may determine that the Q3 of the DC/DC power converter 1 is faulty.

In one embodiment, if detecting that the short circuit component of the DC/DC power converter 1 is the Q1 or the Q3, the inverter power supply system may turn on the Q2 of the DC/DC power converter 1, so that the F1 and the F2 of the DC/DC power converter 1 are blown, to disconnect the DC/DC power converter 1 from another DC/DC power conversion module.

In one embodiment, if detecting that the short circuit component of the DC/DC power converter 1 is the Q1 or the Q3, the inverter power supply system may alternatively turn off the relay. When there is no current in the relay, the inverter power supply system may stop DC/DC and DC/AC circuits of the DC/DC power converter 1, to isolate a fault.

In this embodiment of the application, the inverter power supply system may detect a fault in each DC/DC power converter by using a logical control module, such as the detection unit (or referred to as the fault detection unit) built in each DC/DC power converter. After detecting the faulty power converter, the inverter power supply system may use the drive unit (or referred to as the control unit) to control the on or off state of the Q1, the Q2, the Q3, or another switch module of the faulty power converter, to isolate the faulty power converter. This ensures normal working of another power converter in the inverter power supply system. This further ensures normal power supply of the inverter power supply system, improves power supply reliability of the inverter power supply system, and enhances applicability.

Figure 5:
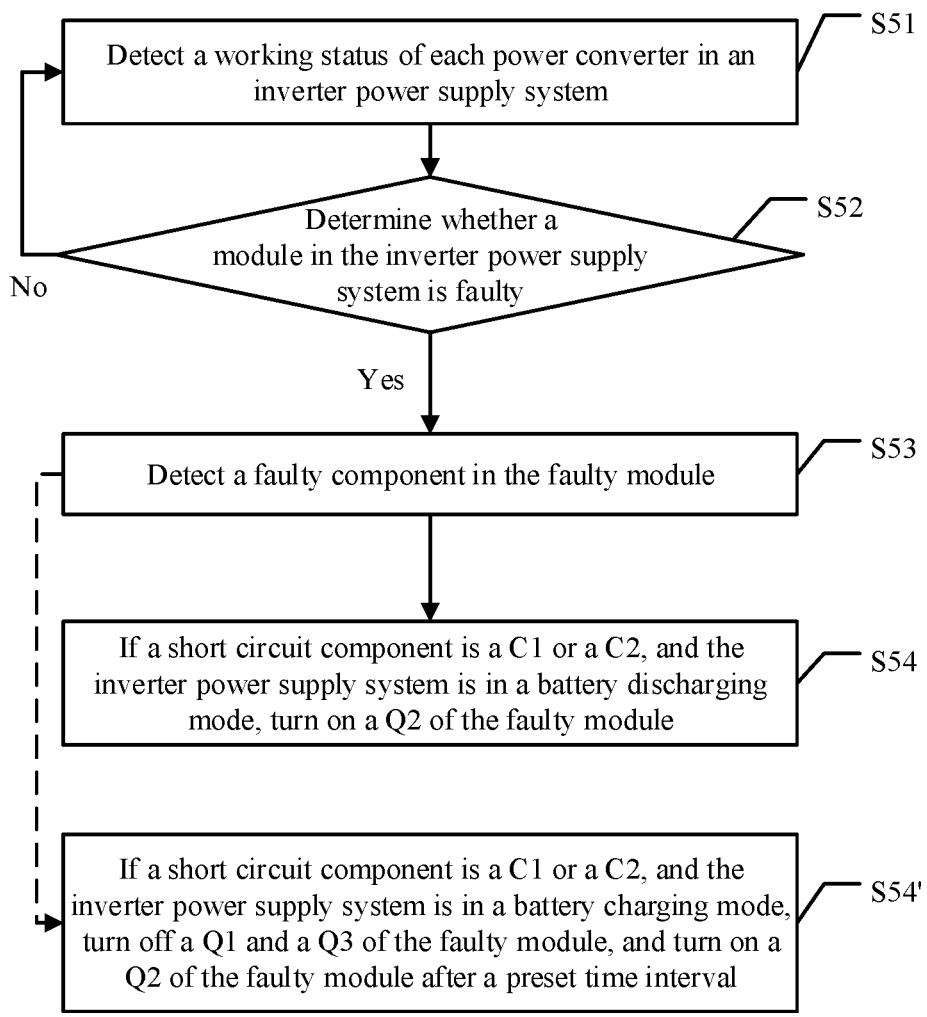
FIG. 5 is a schematic flowchart of a troubleshooting method for a power supply device according to an embodiment of the application.

FIG. 5 is a schematic flowchart of a troubleshooting method for a power supply device according to an embodiment of the application. The troubleshooting method provided in this embodiment of the application is applicable to an inverter power supply system in the power supply device. For a structure of the inverter power supply system, refer to the schematic diagrams of the structures shown in FIG. 1 to FIG. 4. Details are not described herein again. The troubleshooting method provided in this embodiment of the application may include the following operations.

S51: Detect a working status of each power converter in the inverter power supply system.

S52: Determine whether a module in the inverter power supply system is faulty. If a module is faulty, perform operation S53; if no module is faulty, continue to perform operation S51.

S53: Detect a faulty component in the faulty module.

In one embodiment, the inverter power supply system may perform operations, such as detecting the faulty power converter and detecting the faulty module in the power converter, by using a detection unit and another functional module that are built in the inverter power supply system. In one embodiment, described in operations S51 to S53, refer to the examples described in the foregoing embodiment. Details are not described herein again.

S54: If a short circuit component is a C1 or a C2, and the inverter power supply system is in a battery discharging mode, turn on a Q2 of the faulty module.

In one embodiment, the inverter power supply system may perform operations, such as controlling a switch module or another component of the faulty power converter, by using a control unit and another functional module that are built in the inverter power supply system. For details, refer to the examples described in the foregoing embodiment. Details are not described herein again.

In one embodiment, if a short circuit component in a first module (for example, a DC/DC power converter 1) is a C1 or a C2, and the DC/DC power converter 1 is in a battery discharging mode before a fault occurs, after the DC/DC power converter 1 is faulty, a Q2 of the DC/DC power converter 1 may be directly turned on, so that an F1 and an F2 of the DC/DC power converter 1 are blown, to isolate the DC/DC power converter 1 from another power converter. For details, refer to the examples described in the foregoing embodiment. Details are not described herein again.

In one embodiment, it can be learned from the examples described in the foregoing embodiment that, if the short circuit component in the DC/DC power converter 1 is a Q1 or a Q3, the Q2 of the DC/DC power converter 1 may be directly turned on, so that the F1 and the F2 of the DC/DC power converter 1 are blown. Further, the DC/DC power converter 1 may be directly disconnected from a battery, to disconnect the DC/DC power converter 1 from another power converter connected in parallel. This ensures normal working of the another power converter.

In one embodiment, the operation S54 in this embodiment of the application may be replaced with the following operation S54'.

S54': If a short circuit component is a C1 or a C2, and the inverter power supply system is in a battery charging mode, turn off a Q1 and a Q3 of the faulty module, and turn on a Q2 of the faulty module after a preset time interval.

In one embodiment, if the short circuit component in the DC/DC power converter 1 is the C1 or the C2, and the DC/DC power converter 1 is in a battery charging mode before the fault occurs, after the DC/DC power converter 1 is faulty, the Q1 and the Q3 of the DC/DC power converter 1 may be turned off, and the Q2 of the DC/DC power converter 1 is turned on after a preset time interval, so that the F1 and the F2 of the DC/DC power converter 1 are blown, to isolate the DC/DC power converter 1 from the another power converter. For one embodiment, refer to the example described in the foregoing embodiment. Details are not described herein again.

In this embodiment of the application, the inverter power supply system may detect a fault in each power conversion module by using a logical control module, such as the detection unit (or referred to as a fault detection unit) built in each DC/DC power converter. After detecting the faulty power converter, the inverter power supply system may use the control unit (or referred to as a processing unit or a drive unit) to control an on or off state of the Q1, the Q2, the Q3, or another switch module of the faulty power converter, to isolate the faulty power converter. This ensures normal working of another power converter in the inverter power supply system, ensures normal power supply of the inverter power supply system, improves power supply reliability of the inverter power supply system, and enhances applicability.

A person of ordinary skill in the art may understand that all or some of the processes of the methods in the embodiments may be implemented by a computer program instructing relevant hardware. The program may be stored in a computer-readable storage medium. When the program runs, the processes of the methods in the embodiments are performed. The storage medium includes: any medium that can store program code, such as a ROM or a random access memory RAM, a magnetic disk or an optical disc.

What is claimed is:

1. A troubleshooting method for a power supply device, wherein the troubleshooting method is applicable to an inverter power supply system in the power supply device, the inverter power supply system comprising at least two direct current to direct current (DC/DC) power supply modules, the at least two DC/DC power supply modules connected in parallel to a same battery and supplying power to a load by using a direct current to alternating current (DC/AC) power supply module, and any DC/DC power supply module of the at least two DC/DC power supply modules comprising fuses F1 and F2, relays K1 and K2, inductors L1 and L2, switch modules Q1, Q2, and Q3, and direct current bus capacitors C1 and C2;
    one terminal of the K1 is connected to a positive terminal of the battery by using the F1, one terminal of the K2 is connected to a negative terminal of the battery by using the F2, the other terminal of the K1 is connected to connection terminals of the Q1 and the Q2 by using the L1, the other terminal of the K2 is connected to connection terminals of the Q2 and the Q3 by using the L2, one terminal of the Q1 is connected to one terminal of the C1, the other terminal of the Q1 is connected to one terminal of the Q2, the other terminal of the Q2 is connected to one terminal of the Q3, the other terminal of the C1 is connected to the other terminal of the Q3 by using the C2, the troubleshooting method comprising:
    if any DC/DC power supply module of the at least two DC/DC power supply modules is detected as faulty, determining a faulty component in a faulty module, wherein the faulty module is said any DC/DC power supply module of the at least two DC/DC power supply modules that is faulty; and
    if the faulty component is a C1 or a C2, and the inverter power supply system is in a battery discharging mode, turning on a Q2 in the faulty module, so that an F1 and an F2 of the faulty module are blown, thereby disconnecting the faulty module from another DC/DC power supply module of the at least two DC/DC power supply modules.

2. The troubleshooting method according to claim 1, wherein the troubleshooting method further comprises:
    if a short circuit component is the C1 or the C2, and the inverter power supply system is in a battery charging mode, turning off a Q1 and a Q3 of the faulty module, and turning on the Q2 of the faulty module after a preset time interval, so that the F1 and the F2 of the faulty module are blown, thereby disconnecting the faulty module from the another DC/DC power supply module.

3. The troubleshooting method according to claim 1, wherein the determining a faulty component in the faulty module if the any DC/DC power supply module of the at least two DC/DC power supply modules is detected as faulty further comprises:
    when the Q2 and a Q1 of the faulty module are in an off state, turning on a Q3 of the faulty module and detecting a current state of an L1 and an L2 of the faulty module, and if it is detected that there is a current flowing in both the L1 and the L2 of the faulty module, determining that the Q1 of the faulty module is short-circuited; or
    when the Q2 and the Q3 of the faulty module are an off state, turning on the Q1 of the faulty module and detecting a current state of the L1 and the L2 of the faulty module, and if it is detected that there is a current both in the L1 and the L2 of the faulty module, determining that the Q3 of the faulty module is short-circuited.

4. The troubleshooting method according to claim 3, wherein the troubleshooting method further comprises:
    if a short circuit component in the faulty module is the Q1 or the Q3, turning on the Q2 of the faulty module, so that the F1 and the F2 of the faulty module are blown, thereby disconnecting the faulty module from the another DC/DC power supply module.

5. The troubleshooting method according to claim 3, wherein the troubleshooting method further comprises:
    if a short circuit component in the faulty module is the Q1 or the Q3, turning off any one or more of a K1, a K2, the Q1, the Q2, or the Q3 of the faulty module, thereby disconnecting a parallel connection between the faulty module and the another DC/DC power supply module.

6. A power supply device, wherein the power supply device comprises an inverter power supply system, the inverter power supply system comprising at least two direct current to direct current (DC/DC) power supply modules, the at least two DC/DC power supply modules connected in parallel to a same battery and supplying power to a load by using a direct current to alternating current (DC/AC) power supply module, and any DC/DC power supply module of the at least two DC/DC power supply modules comprising fuses F1 and F2, relays K1 and K2, inductors L1 and L2, switch modules Q1, Q2, and Q3, and direct current bus capacitors C1 and C2;
    one terminal of the K1 is connected to a positive terminal of a battery by using the F1, one terminal of the K2 is connected to a negative terminal of the battery by using the F2, the other terminal of the K1 is connected to connection terminals of the Q1 and the Q2 by using the L1, the other terminal of the K2 is connected to connection terminals of the Q2 and the Q3 by using the L2, one terminal of the Q1 is connected to one terminal of the C1, the other terminal of the Q1 is connected to one terminal of the Q2, the other terminal of the Q2 is connected to one terminal of the Q3, the other terminal of the C1 is connected to the other terminal of the Q3 by using the C2, and any DC/DC power supply module of the at least two DC/DC power supply modules of the power supply device comprises:
    a detection unit configured to detect a voltage signal and/or a current signal in any DC/DC power supply module of the at least two DC/DC power supply modules, and determine, based on the detected voltage signal and/or the detected current signal, whether the any DC/DC power supply module of the at least two DC/DC power supply modules is a faulty module; wherein, the detection unit is further configured to, when detecting that any DC/DC power supply module of the at least two DC/DC power supply modules is faulty, detect a faulty component in the faulty module; and a control unit configured to, when the detection unit detects that the faulty component in the faulty module is a C1 or a C2, and the inverter power supply system is in a battery discharging mode, turn on a Q2 of the faulty module, wherein an F1 and an F2 of the faulty module are blown, thereby disconnecting the faulty module from another DC/DC power supply module.

7. The power supply device according to claim 6, wherein the control unit is further configured to:

when the detection unit detects that the faulty component in the faulty module is the C1 or the C2, and the inverter power supply system is in a battery charging mode, turn off a Q1 and a Q3 of the faulty module, and turn on the Q2 of the faulty module after a preset time interval, so that the F1 and the F2 of the faulty module are blown, thereby disconnecting the faulty module from the another DC/DC power supply module.

8. The power supply device according to claim 6, wherein the detection unit is further configured to:

when the Q2 and a Q1 of the faulty module are in an off state, turn on a Q3 of the faulty module and detecting a current state of an L1 and an L2 of the faulty module, and if it is detected that there is a current flowing in both the L1 and the L2 of the faulty module, determine that the Q1 of the faulty module is short-circuited; or when the Q2 and the Q3 of the faulty module are in an off state, turn on the Q1 of the faulty module and detecting a current state of the L1 and the L2 of the faulty module, and if it is detected that there is a current flowing in both the L1 and the L2 of the faulty module, determine that the Q3 of the faulty module is short-circuited.

9. The power supply device according to claim 8, wherein the control unit is further configured to:

when the detection unit detects that a short circuit component in the faulty module is the Q1 or the Q3, turn on the Q2 of the faulty module, so that the F1 and the F2 of the faulty module are blown, thereby disconnecting the faulty module from the another DC/DC power supply module.

10. The power supply device according to claim 8, wherein the control unit is further configured to:

when the detection unit detects that the short circuit component in the faulty module is the Q1 or the Q3, turn off any one or more of a K1, a K2, the Q1, the Q2, or the Q3 of the faulty module, thereby disconnecting a parallel connection between the faulty module and the another DC/DC power supply module.

* * * * *